US012482722B2

United States Patent
Huether

(10) Patent No.: US 12,482,722 B2
(45) Date of Patent: Nov. 25, 2025

(54) DISC CELL ASSEMBLY CLAMP

(71) Applicant: Advanced Energy Industries, Inc., Denver, CO (US)

(72) Inventor: Christian Huether, Ruethen (DE)

(73) Assignee: Advanced Energy Industries, Inc., Denver, CO (US)

( * ) Notice: Subject to any disclaimer, the term of this patent is extended or adjusted under 35 U.S.C. 154(b) by 517 days.

(21) Appl. No.: 18/071,845

(22) Filed: Nov. 30, 2022

(65) Prior Publication Data
US 2024/0179872 A1 May 30, 2024

(51) Int. Cl.
*H01L 23/40* (2006.01)
*H01L 23/433* (2006.01)

(52) U.S. Cl.
CPC .......... *H01L 23/40* (2013.01); *H01L 23/4338* (2013.01); *H01L 2023/4081* (2013.01); *H01L 2023/4087* (2013.01)

(58) Field of Classification Search
CPC .. H01L 23/40; H01L 23/4338; H01L 23/4087
See application file for complete search history.

(56) References Cited

U.S. PATENT DOCUMENTS

| | | | | |
|---|---|---|---|---|
| 2,948,317 A * | 8/1960 | Munro | ................... | F16B 41/002 411/352 |
| 2,967,557 A * | 1/1961 | Tait | ...................... | F16B 5/0208 411/999 |
| 3,314,696 A * | 4/1967 | Ferguson | ............ | F16L 37/0885 285/305 |
| 3,343,581 A * | 9/1967 | Martin | .................. | F16B 5/0208 292/251 |
| 4,915,557 A * | 4/1990 | Stafford | ................ | F16B 5/0208 411/258 |
| 6,468,011 B2 * | 10/2002 | Mayer | ..................... | F16B 21/18 411/153 |
| 6,955,512 B2 * | 10/2005 | Allen | ....................... | H05K 7/14 211/26 |
| 8,454,287 B2 * | 6/2013 | Ye | ........................ | H01L 23/4006 411/353 |

(Continued)

FOREIGN PATENT DOCUMENTS

| CN | 203200029 U | 9/2013 |
|---|---|---|
| CN | 111681995 A | 9/2020 |

(Continued)

OTHER PUBLICATIONS

International Search Report and Written Opinion issued in international application No. PCT/US2023/081641, Apr. 8, 2024, 35 pages.

*Primary Examiner* — David A Zarneke
(74) *Attorney, Agent, or Firm* — NOD Law PC

(57) ABSTRACT

Method and apparatuses for clamping a disc cell assembly. An apparatus includes a first plate coupled to the disc cell assembly, a second plate, and one or more disc springs between the plates configured to apply a clamping force to the disc cell assembly when compressed. A method includes adjusting the clamping force via a central fastener coupled to the first and second plates until a desired force has been achieved. Perimeter fasteners coupled to the first plate, second plate, and the disc cell assembly maintain the clamping force after adjustment.

13 Claims, 5 Drawing Sheets

(56) References Cited

U.S. PATENT DOCUMENTS

| | | | | |
|---|---|---|---|---|
| 8,511,956 B2* | 8/2013 | Liu | .................... | H01L 23/4006 |
| | | | | 411/107 |
| 8,979,458 B2* | 3/2015 | Sun | .................... | H01L 23/4006 |
| | | | | 411/353 |
| 2009/0142158 A1* | 6/2009 | Dai | ...................... | F16B 41/002 |
| | | | | 411/353 |
| 2023/0077315 A1* | 3/2023 | Peng | .................... | H05K 1/0203 |
| 2024/0401632 A1* | 12/2024 | Lan | ..................... | H05K 7/2039 |
| 2024/0401633 A1* | 12/2024 | Lan | ..................... | H05K 7/2039 |
| 2024/0402766 A1* | 12/2024 | Lan | ..................... | H01L 23/4006 |
| 2024/0402768 A1* | 12/2024 | Lan | ......................... | G06F 1/183 |
| 2024/0402769 A1* | 12/2024 | Lan | ........................... | G06F 1/20 |

FOREIGN PATENT DOCUMENTS

| | | | |
|---|---|---|---|
| CN | 112630615 A | | 4/2021 |
| CN | 114446902 B | | 5/2022 |
| DE | 202020102100 U1 | | 4/2020 |
| IN | 214579 B | | 2/2008 |

\* cited by examiner

DISC CELL ASSEMBLY CLAMP

BACKGROUND

Field

The present invention relates generally to clamping devices, and more particularly, to clamped disc cell assemblies.

Background

High power disc cells, which may house thyristors or diodes, generally have high heat dissipation and are consequently often clamped between heatsinks that provide electric and thermal conduction. The clamping force holding such disc cells is tightly controlled and typically provided by a spring pack to multiple stacked disc cells of a clamped disc cell assembly. Such a clamping force is often engaged and calibrated using a hydraulic press that compresses the spring pack with a known force. However, hydraulic presses are expensive, and determining the clamping force present within a clamped disc cell assembly without a hydraulic press may be challenging. Furthermore, repairs of such clamped disc cell assemblies may often require recalling the entire clamped disc cell assembly to a location with a hydraulic press, rather than repairing on-site with minimal downtime.

There is therefore a need in the art for a new clamped disc cell assembly design with a new disc cell assembly clamp that addresses some of the current shortcomings, particularly those involving the limitations associated with a hydraulic press being used to engage and calibrate a clamping force of a clamped disc cell assembly.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some aspects of the present disclosure may be characterized as an apparatus for clamping a disc cell assembly that includes a first plate, a second plate, and one or more disc springs between the first and second plate. The one or more disc springs between the first and second plate may be configured to apply a clamping force to the disc cell assembly when compressed. The apparatus may include a central fastener configured to adjustably compress the one or more disc springs may pass through the second plate into the first plate. The apparatus may include a plurality of perimeter fasteners configured to secure the second plate in place may maintain the clamping force provided by the one or more disc springs to the disc cell assembly.

Other aspects of the present disclosure may be characterized as an apparatus for clamping a disc cell assembly that includes means for compressing one or more disc springs between a first and second plate to apply a clamping force to the disc cell assembly and means for securing the second plate in place and maintaining the clamping force provided by the one or more disc springs to the disc cell assembly.

Yet other aspects of the present disclosure may be characterized as a method for clamping a disc cell assembly that includes coupling a first plate to the disc cell assembly, coupling one or more disc springs to the disc cell assembly on top of the first plate, coupling a second plate to the disc cell assembly on top of the one or more disc springs, and securing the first plate, the second plate, and the one or more disc springs together with fasteners. The method may include inserting a central screw through the second plate and into the first plate with no effective force applied to the one or more disc springs, tightening the central screw to compress the one or more disc springs until a desired clamping force is provided to the disc cell assembly by the one or more disc springs, and tightening the fasteners to secure a position of the second plate and maintain the desired clamping force provided to the disc cell assembly by the on or more disc springs.

DETAILED DESCRIPTION

Figure 1:
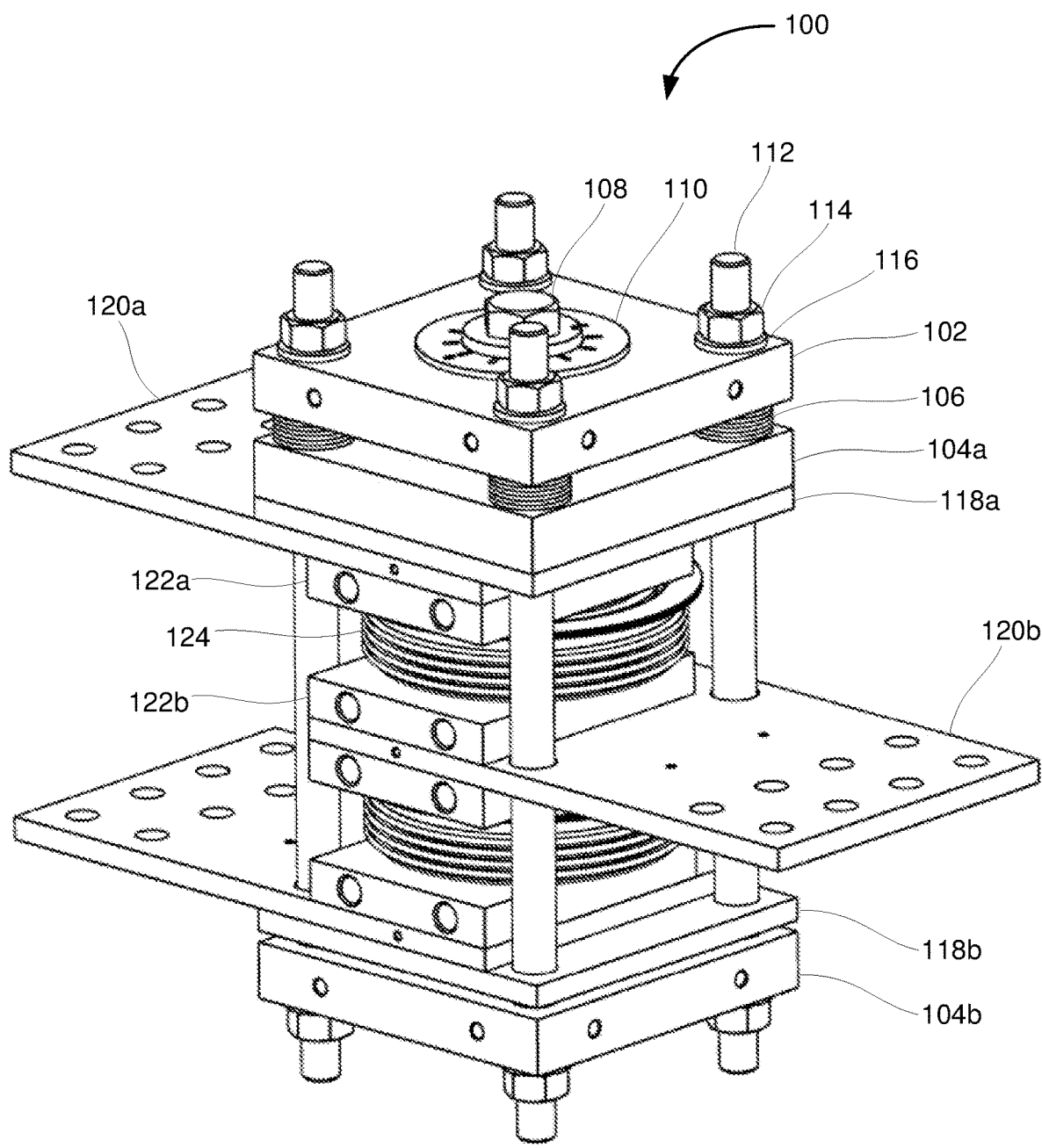
FIG. 1 illustrates an exemplary clamped disc cell assembly with an exemplary clamping apparatus, in accordance with one or more embodiments.

The word "exemplary" is used herein to mean "serving as an example, instance, or illustration." Any embodiment described herein as "exemplary" is not necessarily to be construed as preferred or advantageous over other embodiments.

The present disclosure may enable a clamped disc cell assembly with a disc cell assembly clamp whose clamping force may be easily determined when engaged without the use of a hydraulic press. Furthermore, the present disclosure may enable engaging and calibrating a clamped disc cell assembly clamping force without a hydraulic press, saving money and time, such as by enabling on-site repairs.

Some embodiments of the present disclosure may comprise an apparatus for clamping a disc cell assembly (i.e., a disc cell assembly clamp or clamping apparatus) configured to provide a clamping force to the disc cell assembly. The clamping apparatus may comprise a first plate, a second plate, and one or more disc springs situated between the first plate and the second plate and configured to apply a clamping force to the disc cell assembly when compressed. For example, the one or more disc springs may be compressed between the first plate and the second plate on a top side of the disc cell assembly, pressing the first plate into the top side of the disc cell assembly when the second plate is held in place. The clamping apparatus may further comprise a central fastener that passes through the second plate and into the first plate and is configured to adjustably compress the one or more disc springs. For example, the central fastener may be a central screw that passes through a central hole of the second plate and into a threaded recess or threaded hole of the first plate. Such a central screw may be tightened to adjustably compress the one or more disc springs by bringing the first plate and the second plate closer together. The clamping apparatus may further comprise a plurality of perimeter fasteners configured to secure the second plate in place and maintain the clamping force provided by the one or more disc springs to the disc cell assembly. For example, the perimeter fasteners may comprise threaded rods spanning an entire length of the disc cell assembly and passing through the first plate and the second plate as well as nuts coupled to each end of the threaded rods configured to secure the second plate in place and maintain the clamping force provided by the one or more disc springs to the disc cell assembly.

In some embodiments, the clamping apparatus may further comprise a third plate on an opposing side of the disc cell assembly to the first plate and second plate and configured to press into the opposing side of the disc cell assembly when the one or more disc springs are compressed and the second plate is held in place. For example, perimeter fasteners coupled to the first, second, and third plates may hold the second and third plate at a fixed distance apart, so that the disc springs apply a clamping force to the first plate and thereby to the disc cell assembly.

In some embodiments, each fastener will hold one or more disc springs between the first plate and the second plate. Disc springs may be held by the fasteners in series, parallel, combination, or otherwise to achieve a desired clamping force to the disc cell assembly.

In some embodiments, the clamping force may be adjusted by a central fastener allowed through a hole in the second plate and into a recess of the first plate. The central fastener may be tightened to reduce the distance between the second plate and the first plate, thereby increasing the force applied by the disc springs to the disc cell assembly. The central fastener may be embodied by a screw that is tightened by rotating into a threaded recess of the first plate. Further, the rotation of the central fastener may be measured by a dial placed circumferentially around the fastener, which may indicate a displacement of the plates and likewise the force applied by the springs. This may enable the disc cell assembly to be compressed to a desired preset clamping force by observing the rotation of the central fastener relative to a zero-point.

In some embodiments, the clamping force applied to the disc cell assembly may be measured at one or more of a plurality of perimeter fasteners in addition to or in replacement of at the central fastener. A measurement method may comprise placing end-stops between the first and second plate at or near one or more of the perimeter fasteners and tensioning the perimeter fasteners until the first and second plates are both hitting the perimeter fastener, indicating a specific clamping force has been achieved.

Referring first to FIG. 1, shown is an exemplary clamped disc cell assembly 100 with an exemplary clamping apparatus. The clamping apparatus includes a top baseplate 104a, a clamping force plate 102, one or more disc springs 106, one or more perimeter fasteners, and a clamping portion. The perimeter fasteners comprise threaded rods 112, nuts 114, and washers 116. As shown, the threaded rod 112 passes through the clamping force plate 102, the springs 106, and the top baseplate 104a with the purpose of coupling each of those components together. The springs 106 are shown encircling the threaded rod 112. Shown at the center of the clamping force plate 102 is a clamping portion comprising a central fastener 108 in the form of a screw and a central fastener dial 110. The clamping force plate 102 includes a hole through which the central fastener 108 may pass through and the top baseplate 104a includes a threaded recess configured to accept a threaded portion of the central fastener 108. The central fastener 108 may be tightened to apply a clamping force between the top baseplate 104a and the clamping force plate 102 whereby the magnitude of the clamping force will be determined by the disc springs 106. The central fastener dial 110 will indicate a displacement between the clamping force plate 102 and the top baseplate 104a as a result of the rotation of the central fastener 108, and thereby indicate the magnitude of the clamping force.

FIG. 1 depicts a design where the plates include four perimeter fasteners (one at each corner of the plates) each with a single disc spring 106. One of ordinary skill in the art will appreciate that the number of perimeter fasteners, as well as the number and arrangement of disc springs 106 coupled to each fastener, may be adjusted as desired for the intended application. An exemplary disc spring 106 arrangement and number may be a 6 stack in a 3-facing-3 configuration in a convex or V-shaped fashion. Furthermore, the perimeter fasteners may be arranged at various radii and angles relative to the central fastener 108 and the geometry of the plates may be adjusted to accept various arrangements of perimeter fasteners.

Below the top baseplate 104a, shown is a top insulator plate 118a separating the top baseplate 104a from a top bus bar 120a of the disc cell assembly. Shown in FIG. 1 is a particular arrangement for a disc cell assembly comprising a top bus bar 120a, top heatsink 122a, disc cell 124, bottom heatsink 122b, and bottom bus bar 120b stacked in series. The top bus bar 120a and bottom bus bar 120b include holes through which the threaded rods 112 pass through. The force provided by the disc springs 106 is then applied as a clamping force to the disc cell assembly. In FIG. 1, shown below the bottom bus bar 120b is a second disc cell configuration similar to that of the first. While FIG. 1 shows a clamped disc cell assembly including two disc cells, one of ordinary skill in the art may appreciate that such an assembly may be modified to contain fewer or more disc cells stacked in series depending upon the desired application. Further, the bottom bus plate of one disc cell may be considered the top bus plate of the next, or other dividers may be used between disc cells. Below the lowest bus plate is a bottom insulator plate 118b separating the bus bar from a bottom baseplate 104b which is coupled to the threaded rods 112. The top insulator plate 118a and the bottom insulator plate 118b are configured to insulate the top baseplate 104a and bottom baseplate 104b, respectively, from electrical current present in the disc cell assembly.

Figure 2:
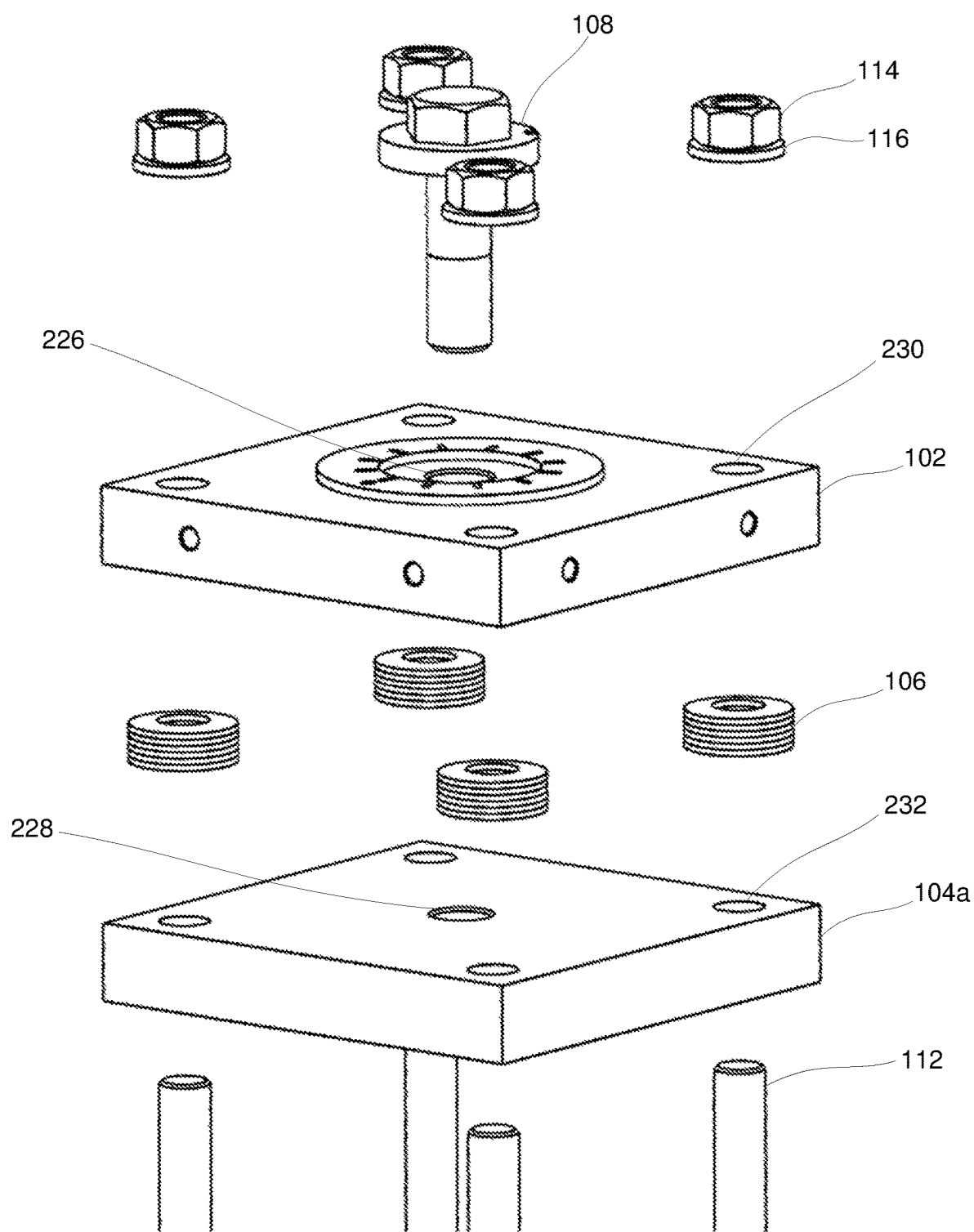
FIG. 2 illustrates an exploded view of the top portion of the exemplary clamped disc cell assembly of FIG. 1, in accordance with one or more embodiments.

Referring next to FIG. 2, shown is an exploded view of the top portion of the exemplary clamped disc cell assembly of FIG. 1. The top baseplate 104a includes one or more perimeter holes 232 and the clamping force plate 102 also includes one or more perimeter holes 230, both of which are positioned so that one or more threaded rods 112 may pass through the holes and the disc springs 106 in order for the nuts 114 to hold the clamped disc cell assembly in place once a desired clamping force has been applied by tensioning the central fastener 108. While nuts 114 and washers 116 are shown to fasten the clamped disc cell assembly in this embodiment, one of ordinary skill in the art may appreciate that there are a plurality of methods to fasten the clamping force plate 102 in place along the threaded rod 112 to preserve the clamping force. Also shown in this exploded view are a central hole 226 bore through the center of the clamping force plate 102, and a threaded central recess 228 bore into the top side center of the top baseplate 104a configured to accept the thread of the central fastener 108.

The perimeter holes 232 of the top baseplate 104a may have a larger diameter at the bottom than the top to accommodate such an insulation sheath while still holding the threaded rod 112 in place. The bottom baseplate 104b may be similarly adjusted to accommodate an insulation sheath on the threaded rods 112. Furthermore, the coupling of the bottom baseplate 104b to the threaded rods 112 may include a variety of fastener methods such as bore holes with washers and nuts, welding, or yet other methods.

Figure 3:
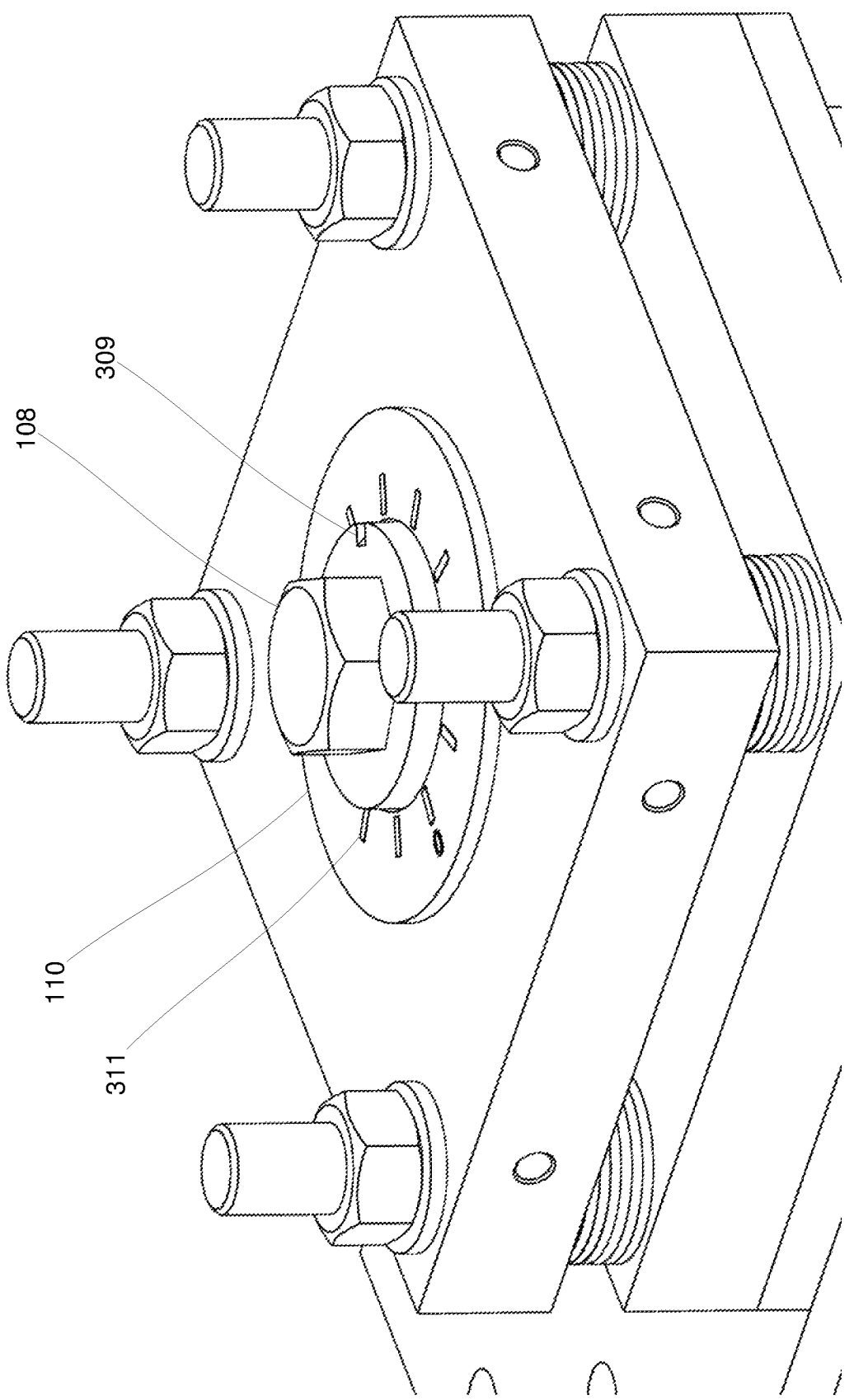
FIG. 3 illustrates a top portion of the exemplary clamped disc cell assembly of FIG. 1, in accordance with one or more embodiments.

Referring next to FIG. 3, shown is a top portion of the exemplary clamped disc cell assembly of FIG. 1. In this embodiment, the central fastener 108 includes an indicator notch 309 to indicate, along with dial tick marks 311 of the central fastener dial 110, the force applied to the springs as a function of the rotation of the central fastener 108. The dial tick marks 311 are spaced circumferentially around the central fastener 108 so that each mark indicates a particular rotation of the central fastener 108. This rotation indicates a displacement of the clamping force plate 102 relative to the top baseplate 104a, which adjusts the force applied to the disc cell assembly by the disc springs 106. Thereby, the clamping force may be accurately adjusted and applied to the disc cell assembly via rotation of the central fastener 108.

Figure 4:
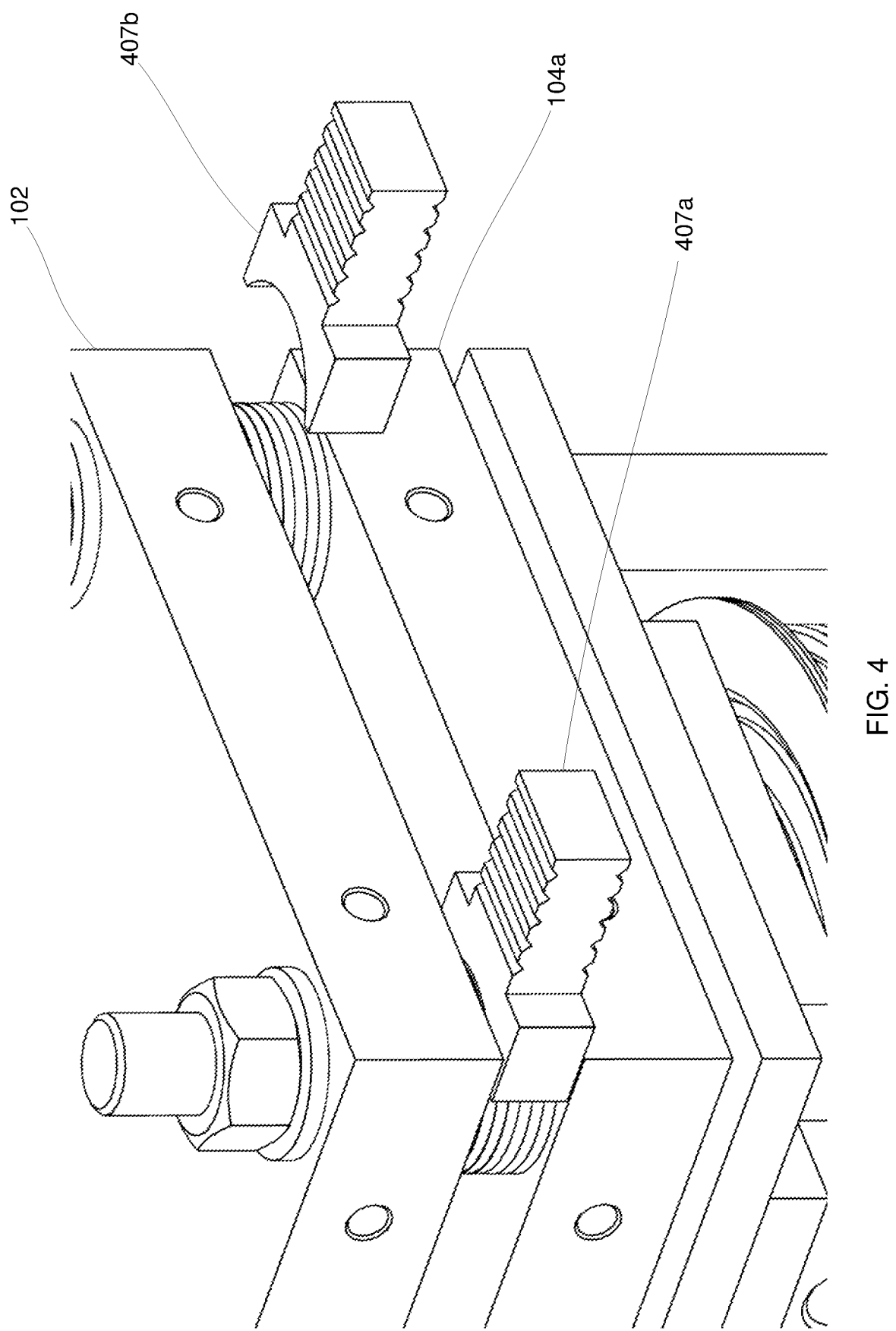
FIG. 4 illustrates a top portion of an exemplary clamped disc cell assembly with end-stops, in accordance with one or more embodiments.

Referring next to FIG. 4, shown is a top portion of an exemplary clamped disc cell assembly with end-stops. In this embodiment, an accurate clamping force may be achieved by tensioning each of the one or more nuts 114 until the top baseplate 104a and clamping force plate 102 are at a distance apart specified by one or more end-stops 407a, 407b. Such a specified distance is associated with a predetermined clamping force desired to be applied to the disc cell assembly.

As one of ordinary skill in the art may appreciate, there are numerous alternatives to physical end-stops and central screw dials that may be utilized to judge the distance between the plates. The distance may also be measured at a plurality of sites along the plates.

Figure 5:
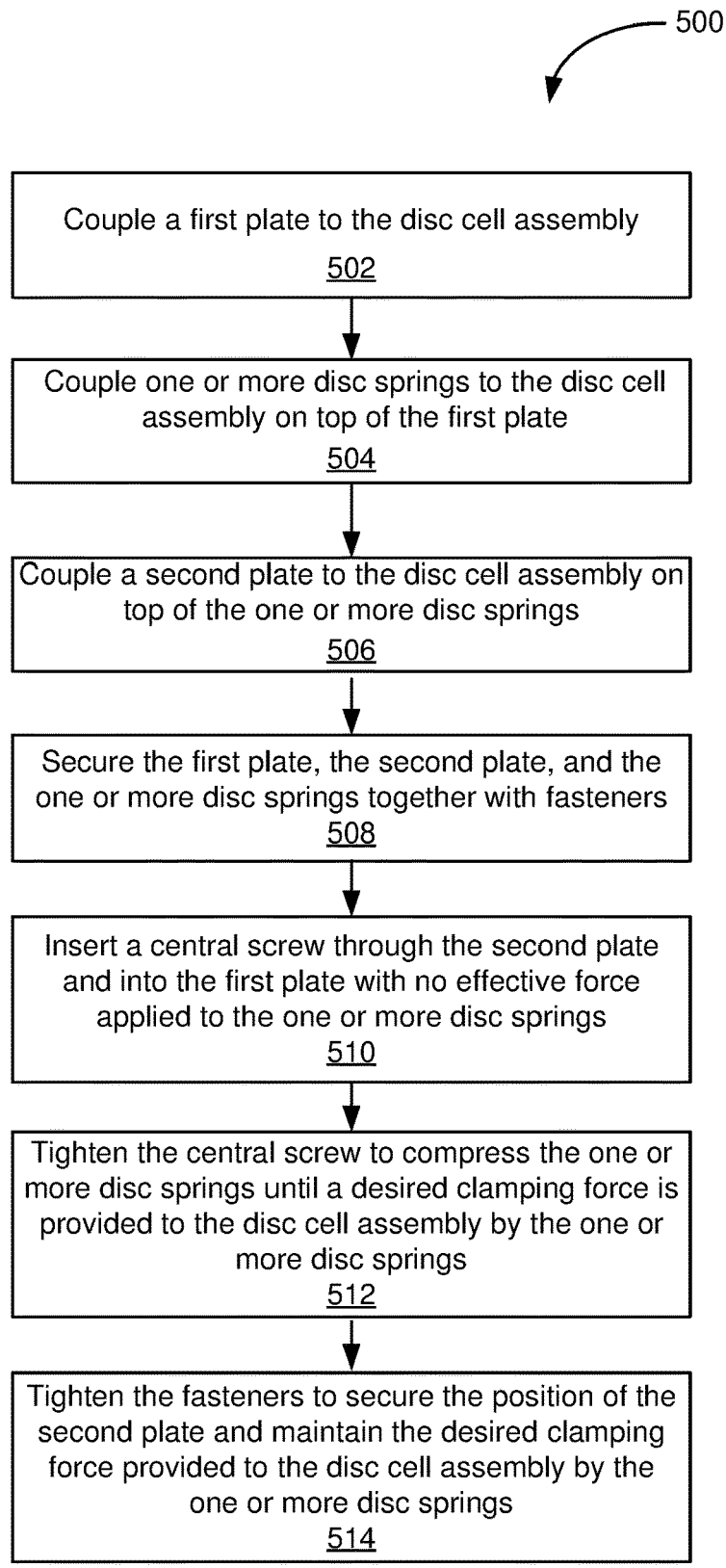
FIG. 5 is a flowchart depicting an exemplary method for clamping a disc cell assembly, in accordance with one or more embodiments.

Referring next to FIG. 5, shown is a flowchart depicting an exemplary method 500 for clamping a disc cell assembly. The method begins by coupling a first plate to the disc cell assembly 502. Then, one or more disc springs are coupled to the disc cell assembly on top of the first plate 504. A second plate is coupled to the disc cell assembly on top of the one or more disc springs 506. Fasteners are then added to secure the first plate, the second plate, and the one or more disc springs 508. Next, a central screw is passed through the second plate and into the first plate with no effective force applied to the one or more disc springs 510. The central screw is then tightened to compress the one or more disc springs until a desired clamping force is provided to the disc cell assembly by the one or more disc springs 512. Lastly, the fasteners are tightened to secure the position of the second plate and maintain the desired clamping force provided to the disc cell assembly by the one more disc springs 514.

In disc cell assemblies that require high clamping forces, it is anticipated the method may be altered such that in place of steps 512 and 514 the method may instead comprise: tightening the central screw and fasteners in combination to compress the one or more disc springs until a desired clamping force is provided to the disc cell assembly by the one or more disc springs. In either case, a further step of removing the central screw from the clamped disc cell assembly may be added at the end of the method. When the central screw is removed, the perimeter fasteners will still maintain the clamping force. In this way, a single central screw may be used to properly tension the clamping force on a plurality of disc cell assemblies to a desired value for production.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for clamping a disc cell assembly, the apparatus comprising:
   a first plate;
   a second plate coupled to the first plate;
   one or more disc springs between the first plate and the second plate configured to apply a clamping force to the disc cell assembly when compressed; and
   a plurality of perimeter fasteners configured to secure the second plate in place and maintain the clamping force provided by the one or more disc springs to the disc cell assembly.

2. The apparatus of claim 1, wherein the one or more disc springs comprise a plurality of disc spring stacks, each disc spring stack directly coupled to a corresponding perimeter fastener.

3. The apparatus of claim 1, further comprising:
   one or more end-stops between the first plate and the second plate configured to indicate a displacement of the one or more disc springs associated with a predetermined clamping force.

4. The apparatus of claim 1, wherein the central fastener comprises a central screw received by a threaded recess of first plate, the central screw configured to compress the one or more disc springs when tightened.

5. The apparatus of claim 4, further comprising:
   a dial associated with the central screw, the dial comprising indicia configured to indicate a degree of rotation of the central screw.

6. The apparatus of claim 1, wherein the perimeter fasteners comprise:
   threaded rods spanning an entire length of the disc cell assembly and passing through the first plate and the second plate; and
   nuts coupled to each end of the threaded rods configured to secure the second plate in place and maintain the clamping force provided by the one or more disc springs to the disc cell assembly.

7. The apparatus of claim 6, wherein the perimeter fasteners are configured to compress the one or more disc springs when tightened.

8. An apparatus for clamping a disc cell assembly, the apparatus comprising:
   a first plate;
   a second plate coupled to the first plate;
   one or more disc springs between the first plate and the second plate configured to apply a clamping force to the disc cell assembly when compressed;
   means for compressing the one or more disc springs; and means for securing the second plate in place and maintaining the clamping force provided by the one or more disc springs to the disc cell assembly.

9. The apparatus of claim 8, wherein the means for securing comprises a plurality of perimeter fasteners and the one or more disc springs comprise a plurality of disc spring stacks, each disc spring stack directly coupled to a corresponding perimeter fastener.

10. The apparatus of claim 8, further comprising:
one or more end-stops between the first plate and the second plate configured to indicate a displacement of the one or more disc springs associated with a predetermined clamping force.

11. The apparatus of claim 8, wherein the means for compressing comprises a central screw received by a threaded recess of first plate, the central screw configured to compress the one or more disc springs when tightened.

12. The apparatus of claim 11, further comprising:
a dial associated with the central screw, the dial comprising indicia configured to indicate a degree of rotation of the central screw.

13. The apparatus of claim 8, wherein the means for securing comprises:
threaded rods spanning an entire length of the disc cell assembly and passing through the first plate and the second plate; and
nuts coupled to each end of the threaded rods configured to secure the second plate in place and maintain the clamping force provided by the one or more disc springs to the disc cell assembly.

* * * * *